United States Patent [19]
Mehdianpour

[11] Patent Number: 5,994,799
[45] Date of Patent: Nov. 30, 1999

[54] POSITIONING APPARATUS FOR A POSITIONING HEAD

[75] Inventor: Mohammad Mehdianpour, Munich, Germany

[73] Assignee: Siemens Aktiengesellschaft, Munich, Germany

[21] Appl. No.: 09/116,001

[22] Filed: Jul. 15, 1998

[30] Foreign Application Priority Data

Feb. 25, 1998 [DE] Germany .............................. 198 07 904

[51] Int. Cl.⁶ ............................ H02K 41/00; H05K 3/30
[52] U.S. Cl. ................................. 310/12; 29/832
[58] Field of Search ................................. 310/12, 13, 14; 33/1 M; 74/479.01; 108/143; 29/829, 832

[56] References Cited

U.S. PATENT DOCUMENTS 4,836,111   6/1989   Kaufmann .................................. 104/89

Primary Examiner—Nestor Ramirez
Assistant Examiner—Judson H. Jones
Attorney, Agent, or Firm—Hill & Simpson

[57] ABSTRACT

A linear guide is fastened onto a chassis of a positioner and an elongated bearer for positioning a head is guided at one end on the linear guide and extends transversely thereto. When the bearer is braked, inertial forces arise which cause elastic excursions of the bearer and set it into oscillation. A drive for the bearer is allocated to the end of the bearer opposite the linear guide. The drive is a linear motor containing an iron or core and produces a restoring torque when there is an angular deviation of the secondary part attached to the bearer, which results in reduction of oscillations of the bearer and more rapid achievement of the processing position.

10 Claims, 1 Drawing Sheet

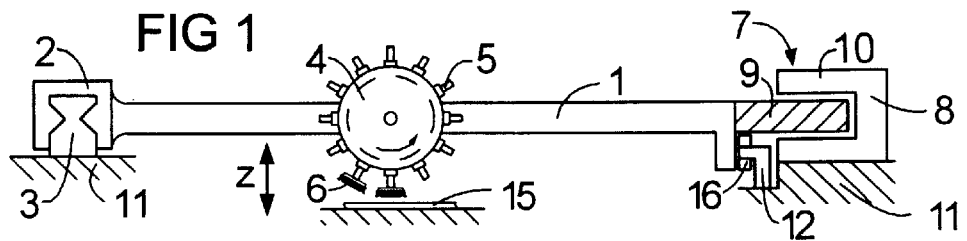
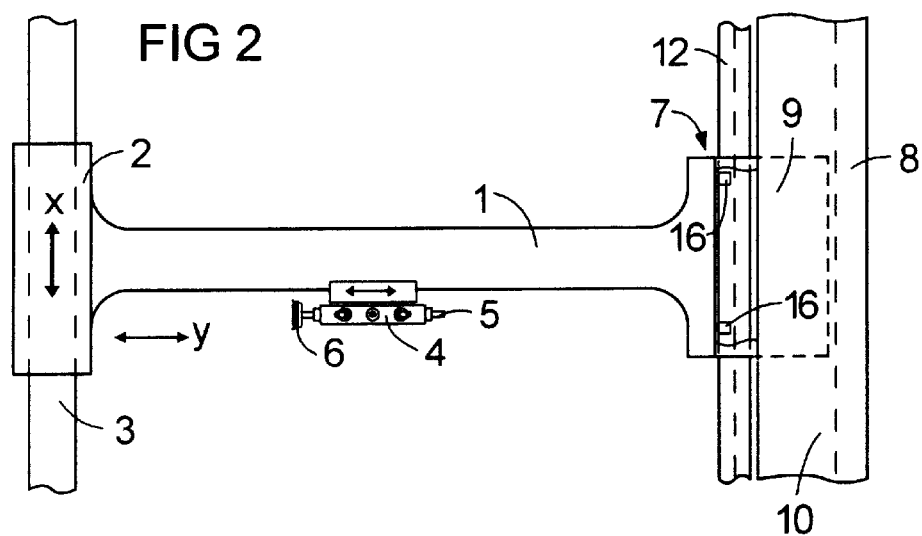
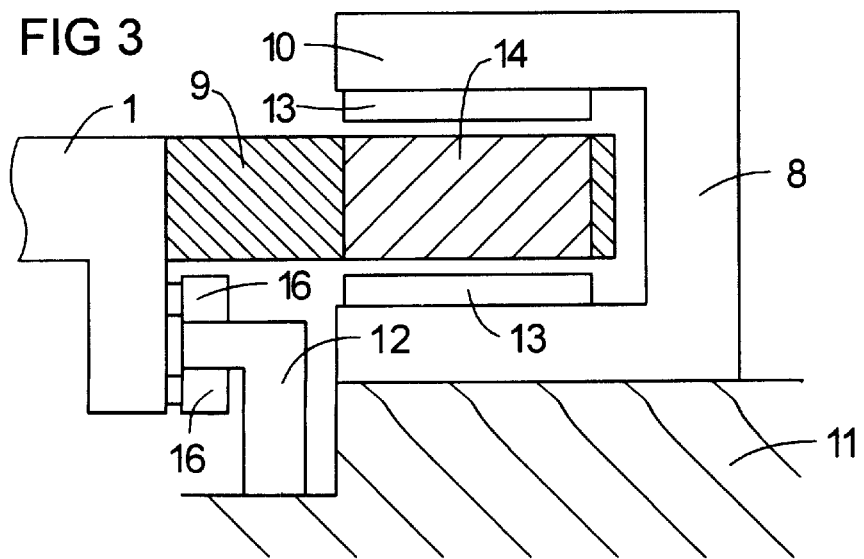

POSITIONING APPARATUS FOR A POSITIONING HEAD

BACKGROUND OF THE INVENTION

1. Field Of The Invention

The present invention relates to a positioning apparatus for a positioning head that can be moved in a guide plane, in particular for equipping electrical circuit boards with components, whereby a chassis of the positioning means comprises a linear guide that defines the x direction, in which an elongated bearer that extends transversely thereto can be moved by means of a drive, on which bearer the positioning head can be moved in the y direction.

2. Description of the Prior Art

An apparatus of this sort is known for example from U.S. Pat. No. 4,836,111. According to this reference, the bearer is guided on a guide rail of the chassis in a double bearing, which defines both the direction of motion and also the angular position of the carriage. A simple wheel-type support bearing on the opposite side serves for the simple support of the bearer on a support rail.

A drive unit is allocated to the double bearing, the unit driving the carriage in the direction of the linear guide. The transverse bearer is provided with a transverse guide on which a positioning head is movably mounted. This head is movable between a component supply and a processing location for the assembly, in order to transport components retrieved from the component supplies to their assembly location on the circuit board.

When the bearer is braked rapidly, transverse forces result from its inherent weight, as well as from the mass of the equipping head, which forces lead to an elastic excursion of the bearer in the x direction. These excursions correspond to the excursions given a crosspiece fixed at one side, and are particularly large at the unguided end. A component can be placed precisely only if the corresponding oscillations in the bearer have decayed sufficiently.

SUMMARY OF THE INVENTION

The present invention is based on the object of providing a positioning unit constructed in such a way that the oscillation behavior improves. This and other objects are provided by a positioner for positioning a head that can be moved in a guide plane such as to equip electrical circuit boards with components, the positioner including a chassis which has a linear guide defining an x-direction, an elongated bearer that extends transversely to the linear guide which is moved by means of a drive, a positioning head on the bearer which is movable in the x-direction so that the x-direction and y-direction define a guide plane, the drive being allocated to one end of the bearer, the linear guide being arranged in the region of one end of the bearer, the guide of the bearer together with the linear guide of the chassis being distributed over a longer segment in the x-direction, and the linear guide and the drive being arranged in the region of the mutually opposite ends of the bearer.

By means of the arrangement of the drive on the side opposite the guide, the bearer can be held fast on this side after braking. The opposite end of the bearer is supported over a greater length, corresponding to its broader base, and is thus fixed in its angular position in such a way that it can make only a small excursion. The duration of the oscillation and the waiting time until the placing of the component are thereby reduced.

Advantageous developments of the invention provided by a linear motor as the drive in which a stationary primary part of the chassis works together with a longitudinally movable secondary part connected with the bearer to form the linear motor and wherein an air gap extending in the x and y-directions is provided between the primary part and the secondary part. Preferably, two air gaps lying over one another are arranged in the z-direction perpendicular to the guide plane and between the primary part and the secondary part. The magnetic forces act opposite to one another in the z-direction in this embodiment. Either the primary part or the secondary part includes a magnetic rail and the other part is a winding which contains a plurality of iron pieces, or cores, wherein the iron pieces or cores of the winding are arranged in series parallel to the magnetic rail. Preferably, the bearer is of an approximately constant cross-section between the two ends.

Through the use of a linear motor, oscillations in the drive system are largely avoided. The air gap that extends in the x and y directions makes it possible for the magnetic forces to operate mainly perpendicular to the guide plane, so that the linear guide is hardly stressed in the y direction.

Two air gaps lie over one another and are arranged in the z direction perpendicular to the guide plane between the primary part and the secondary part so that the magnetic forces act opposite to one another in the z direction. With respect to the z direction, there result magnetic forces that operate in opposed directions, canceling each other out.

Either the primary part or the secondary part has a magnetic rail and the other part is a winding with a core made of multiple iron parts in series which are in a direction parallel to the magnetic rail so that a restoring torque is expected on the bearer. Should the secondary part become out of angular position due to an excursion of the bearer in the x direction and to considerable directional forces which result, a restoring moment or torque is exerted on the bearer. This can thus be regarded statically as a crosspiece clamped at both sides, with an S-shaped elastic line and with a correspondingly small excursion.

Previously, it was standard to equip the bearer, clamped at one end, with a cross-section that becomes smaller towards the free end, corresponding to its bending stress. A bearer according to the present invention is uniformly stressed over its entire length, and can thus be constructed in a cost-saving manner provided the bearer has a cross-section that remains uniform. The smaller excursion makes it possible to shorten the positioning duration and/or to lengthen the bearer, in order to enable retrieval of components from an enlarged peripheral supply region.

By the bearer having an approximate constant cross-section between the two ends, the driven end of the bearer is guided precisely in the z direction, whereby resulting magnetic forces acting in the z direction can be compensated without distortion or twisting in the y direction. By providing a positioner for the positioning head that can be moved in a guide plane wherein a chassis of the positioner has a linear guide that defines the x direction and an elongated bearer that extends transversely to the x direction which can be moved by a drive and on which a positioning head is moved in a y direction, the x and y directions defining the guide plane. The linear guide being arranged in the region of the end of the bearer, the guide of the bearer working together with the linear guide of the chassis is distributed over a longer segment in the x direction or extends over this segment and on the side of the bearer opposite the linear guide. The chassis includes a guide path extending in the x direction for guide parts of the other bearer end which guides this part against deviations in the z direction perpendicular to the guide plane, the guide parts being unguided in the guide path in the x direction and the guide parts being distributed over a longer segment of the x direction or extending over this segment, The previously standard freely protruding bearers were inherently twisted by the eccentrically acting inertial forces, in particular those of the positioning head, especially when the positioning head was located at the outermost free end. By means of the longer guiding of the bearer against excursion in the z direction, such twisting is largely prevented, and the torsion oscillations connected therewith are avoided.

The guide parts are preferably guided in forced fashion without play along the guide path in a mutually embracing arrangement against deviations in the z direction. The guide path is preferably a guide rail and the guide parts are guide rollers, the guide rollers being arranged one over the other on both sides of the guide rail relative to the z direction. Specifically, the bearer includes two roller pairs arranged one after the other in the z direction and spaced apart from another pair of guide rollers positioned one over the other in the z direction so that a low-friction guiding with little play is enabled, which is in accordance with the required length compensation in the bearer.

BRIEF DESCRIPTION OF THE DRAWINGS

In the following, the invention is explained in more detail on the basis of an exemplary embodiment shown in the drawing.

FIG. 1 shows a side view of a bearer with a placement head, a linear guide and a linear motor;

FIG. 2 shows a top view of the parts according to FIG. 1; and

FIG. 3 shows a section through the linear motor according to FIG. 1.

DETAILED DESCRIPTION OF THE PREFERRED EMBODIMENTS

According to FIGS. 1 and 2, an elongated bearer 1 with a broadened base 2 is movably guided in a linear guide 3 in an x direction. The bearer 1, extending in the y direction transverse to the x direction, carries a positioning head 4, fashioned as a placement head, with suction pipettes 5 arranged in stellate form, on which electrical components 6 are held. Underneath the positioning head 4, an electrical circuit board 15 is located, on which the components 6 can be placed in the z direction perpendicular to the x and y directions.

The positioning head is movably guided in the y direction on the bearer 1, and can, thus, be moved within a surface region limited by the path of motion of the bearer 1 and of the positioning head 4. The z motion of the components 6 is enabled e.g. by a telescopic sliding out of the suction pipette 5 from the positioning head 4.

A linear motor 7 is arranged on the end of the bearer 1 opposite the linear guide 3, the motor being formed from a stationary primary part 8 and a secondary part 9 that is connected with the bearer 1 and can be moved in the x direction, whereby the primary part 8 extends over the entire path of motion of the bearer 1 in the x direction. The shorter secondary part 9 is attached to a broadened end of the bearer 1. The primary part 8 is fashioned with a U shape, and comprises arms 10 that lie one over the other on both sides of the secondary part in the z direction, the limbs surrounding the secondary part 9 at least partially. Between the two parts, two air gaps are formed extending in the x and y directions, so that only small forces acting on the bearer 1 in the y direction can be exerted.

The linear guide 3 and the primary part 8 are fastened to a chassis 11 of the positioning means. A guide rail 12 that extends in the x direction is likewise attached to the chassis 11 in the vicinity of the primary part 8, and comprises a guide web that is bent off in the y direction. Guide rollers 16 that extend toward the guide rail 12 are attached to the linear motor 7, the rollers grasping the guide rail 12 on both sides and thus guiding the bearer 1 against deviations in the z direction, without permitting twisting in the y direction. At the broadened end of the bearer 1, two roller pairs are attached with a spacing from one another. These prevent twisting of the bearer 1 about its y axis, and increase the stability of the guide system.

According to FIG. 3, magnetic rails 13 are attached to the inner sides—facing the secondary part 9—of the arms 10. The secondary part 9 is fashioned as a winding part, and comprises iron parts 14 arranged one after the other in the x direction, coinciding with the magnetic rails 13. The magnetic forces acting between the parts counteract an angular deviation between the primary part 8 and the secondary part 9. In this way, a countermoment is exerted on the bearer 1, which reduces the bending moment constructed therein, and thus reduces the excursion of the bearer.

Thus, there is shown and described a linear guide on a chassis of a positioner and an elongated bearer for a positioning head. The drive for the bearer is a linear motor at one end of the bearer which produces a restoring torque when an angular deviation occurs due to inertial forces of and resulting oscillations that occur upon braking. The oscillations in the bearer are reduced and the processing position is thereby achieved more rapidly for positioning, for example, circuit elements on a circuit board.

Although various minor modifications might be suggested by those skilled in the art, it should be understood that my wish to embody within the scope of the patent warranted hereon all such modifications as reasonably and properly come with the scope of my contribution to the art.

I claim as my invention:

1. A positioner for positioning a head which is to be moved in a guide plane, comprising:
    a chassis;
    a linear guide defining an x direction;
    an elongated bearer extending transversely to said linear guide;
    a drive for moving said elongated bearer;
    a positioning head on said elongated bearer so as to be movable in a y direction, with the x direction and the y direction defining a guide plane;
    said drive being allocated to a first end of said bearer;
    said linear guide being provided at an opposite end of said bearer from said drive; and
    a guide for said bearer being operative with said linear guide and being distributed over an elongated segment of said linear guide in the x direction.

2. A positioner as claimed in claim 1, wherein said drive is a linear motor including a stationary primary part on said chassis and further including a longitudinally movable secondary part connected to said bearer which secondary part cooperates with said primary part, said primary part and said secondary part defining an air gap extending in the x direction and the y direction.

3. A positioner as claimed in claim 2, wherein said primary part and said secondary part define two air gaps lying over one another in a z direction perpendicular to the guide plane, magnetic forces of said drive acting opposite to one another in the z direction.

4. A positioner as claimed in claim 2, wherein one of said primary part and said secondary part includes at least one magnetic rail, another of said primary part and said secondary part being a winding including a ferro-magnetic core.

5. A positioner as claimed in claim 4, wherein said ferro-electric core includes a plurality of ferro-magnetic cores arranged in a series parallel to said at least one magnetic rail.

6. A positioner as claimed in claim 1, wherein said bearer is of a substantially constant cross-section between its two ends.

7. A positioner for positioning a head that is to be moved in a guide plane, comprising:

a chassis;

a linear guide on said chassis which defines an x direction;

an elongated bearer extending transversely to said x direction;

a drive operable to move said elongated bearer;

a positioning head movable in a y direction on said elongated bearer, the x direction and the y direction defining a guide plane;

a linear guide of said chassis at one end of said bearer;

a guide of said bearer cooperating with said linear guide and being distributed over an elongated segment in the x direction;

a guide path on a side of the bearer opposite said linear guide, said guide path extending in the x direction;

guide parts for said guide path, said guide parts being free of constraint in the x direction and said guide path and said guide parts inhibiting deviations in a z direction perpendicular to the guide plane;

said guide parts being distributed over an elongated segment of said guide path in the x direction.

8. A positioner as claimed in claim 7, wherein said guide parts are forcibly embracing said guide path in the z direction.

9. A positioner as claimed in claim 8, wherein said guide path is a guide rail, said guide parts are guide rollers, and said guide rollers are arranged one over another on opposite sides of said guide rail relative to the z direction.

10. A positioner as claimed in claim 8, wherein said bearer includes two roller pairs arranged one after another and spaced from one another in the x direction, the rollers of the roller pairs being positioned one over the other in the z direction.

\* \* \* \* \*